United States Patent
Varaprasad

(10) Patent No.: US 8,541,062 B2
(45) Date of Patent: Sep. 24, 2013

(54) MULTI-LAYER ANTI-REFLECTIVE COATINGS AND PROCESSES THEREFOR

(75) Inventor: Desaraju V. Varaprasad, Ann Arbor, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 850 days.

(21) Appl. No.: 12/567,880

(22) Filed: Sep. 28, 2009

(65) Prior Publication Data
US 2011/0073174 A1 Mar. 31, 2011

(51) Int. Cl.
*C08F 2/48* (2006.01)

(52) U.S. Cl.
USPC .............................. 427/493; 427/508; 427/515

(58) Field of Classification Search
USPC .......................................... 427/493, 508, 515
See application file for complete search history.

(56) References Cited

U.S. PATENT DOCUMENTS

| | | | |
|---|---|---|---|
| 4,510,344 A | 4/1985 | Berman | |
| 4,806,436 A | 2/1989 | Tada et al. | |
| 5,977,477 A | 11/1999 | Shiozaki | |
| 6,506,622 B1 | 1/2003 | Shiozaki | |
| 7,700,870 B2 | 4/2010 | Thomsen et al. | |
| 2003/0087102 A1* | 5/2003 | Yamaya et al. | 428/419 |
| 2003/0199603 A1* | 10/2003 | Walker et al. | 522/99 |
| 2005/0161330 A1* | 7/2005 | Toi et al. | 204/484 |
| 2005/0200405 A1 | 9/2005 | Shinohara et al. | |
| 2008/0234461 A1* | 9/2008 | Fukushige | 528/374 |
| 2008/0271782 A1* | 11/2008 | Sharma | 136/256 |

FOREIGN PATENT DOCUMENTS

JP 07122764 5/1995

OTHER PUBLICATIONS

English language abstract for JP 07-122764.

* cited by examiner

*Primary Examiner* — Elena T Lightfoot
(74) *Attorney, Agent, or Firm* — O'Brien Jones PLLC

(57) ABSTRACT

Methods for making multi-layered anti-reflective coatings are disclosed. Un-solgel precursor compositions may be prepared having inorganic oxide precursors and UV curable acrylic monomer mixtures, deposited on a substrate, and subsequently the coated substrate may be cured by exposure to electromagnetic radiation, such as UV radiation. The coating layers may be heated using a temperature sufficient to burn off organic content and form a multi-layer anti-reflective coating. Substrates comprising such coatings and photovoltaic devices comprising such substrates and coatings are also disclosed.

12 Claims, 3 Drawing Sheets

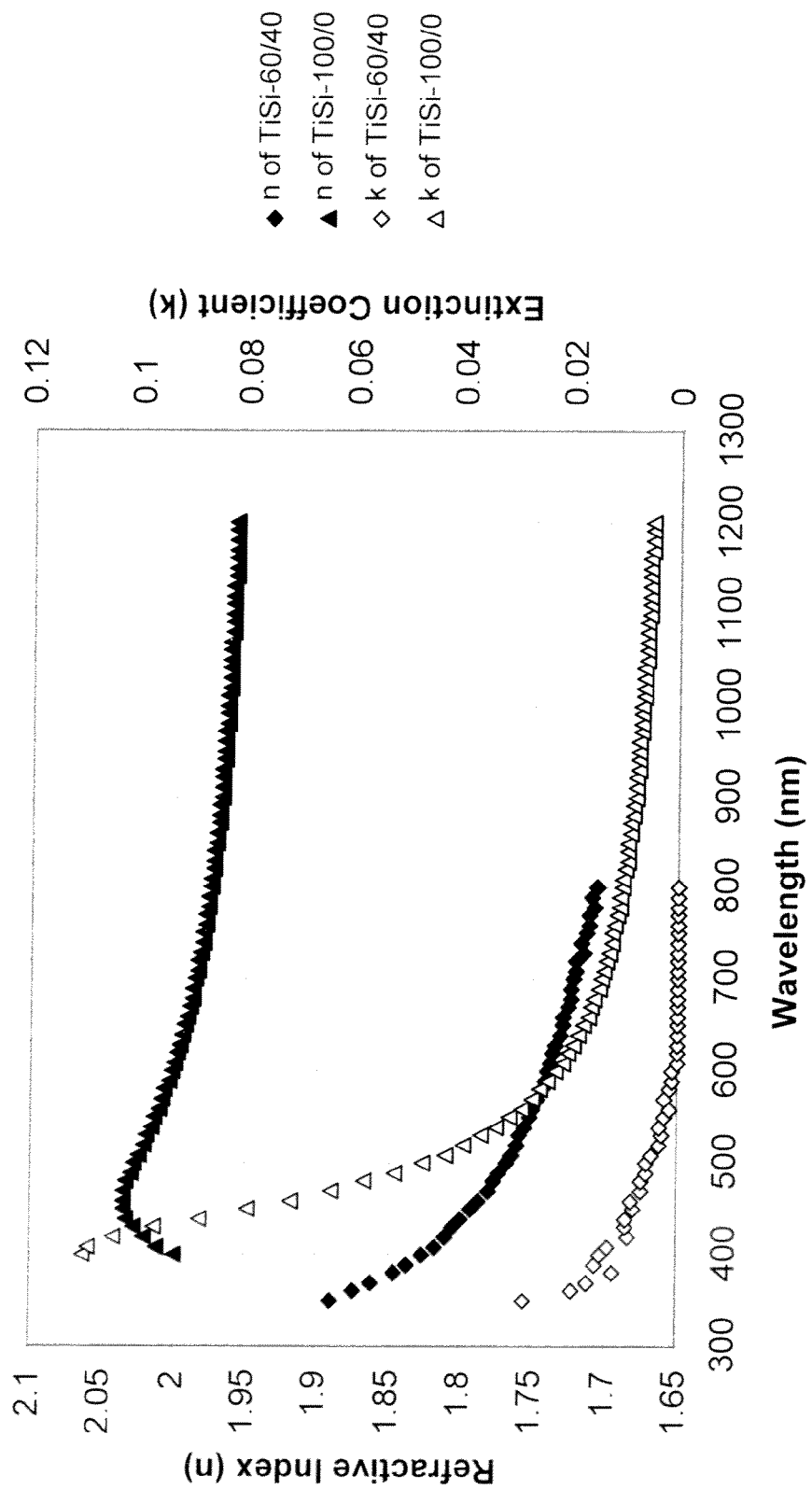

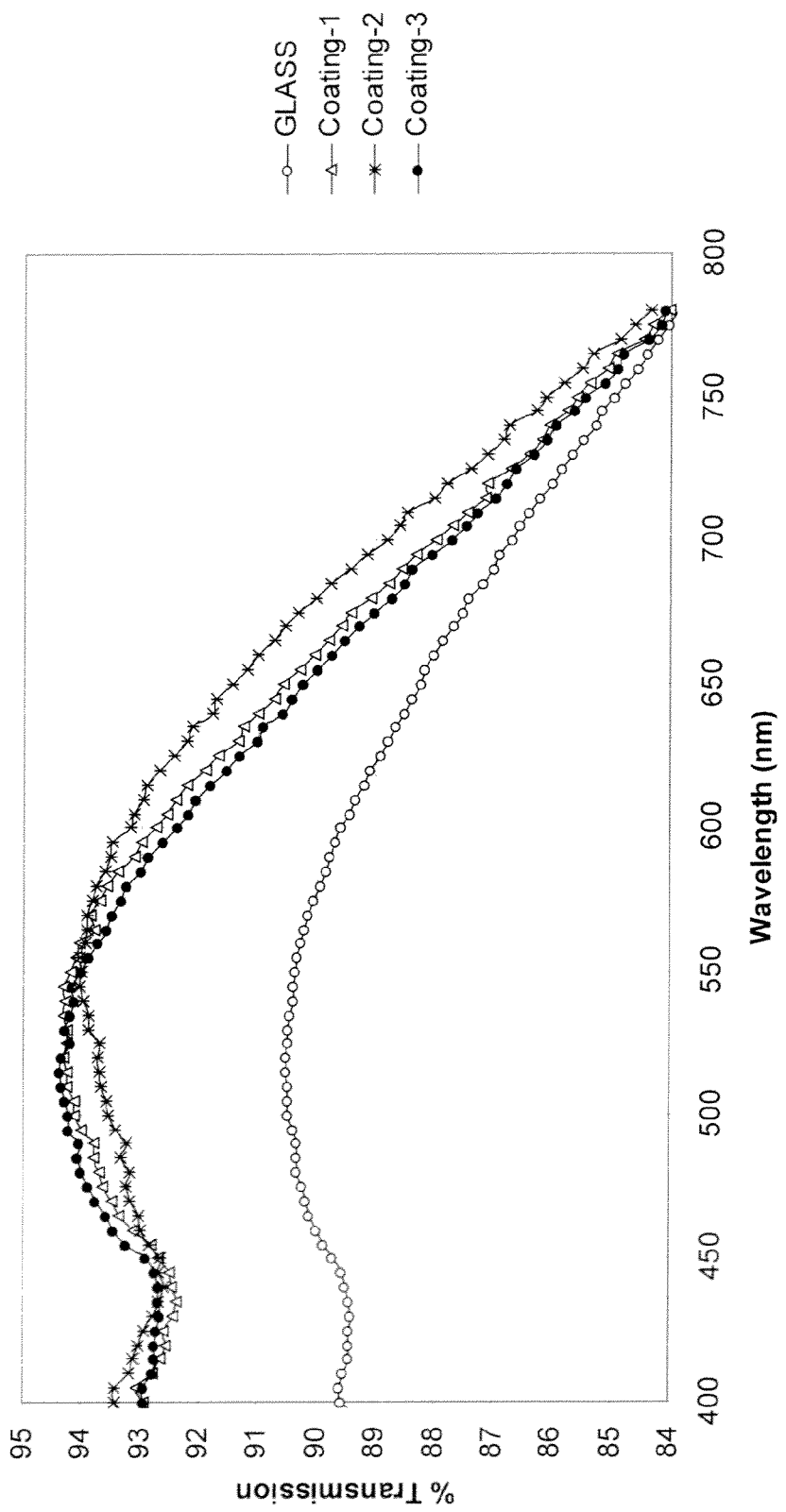

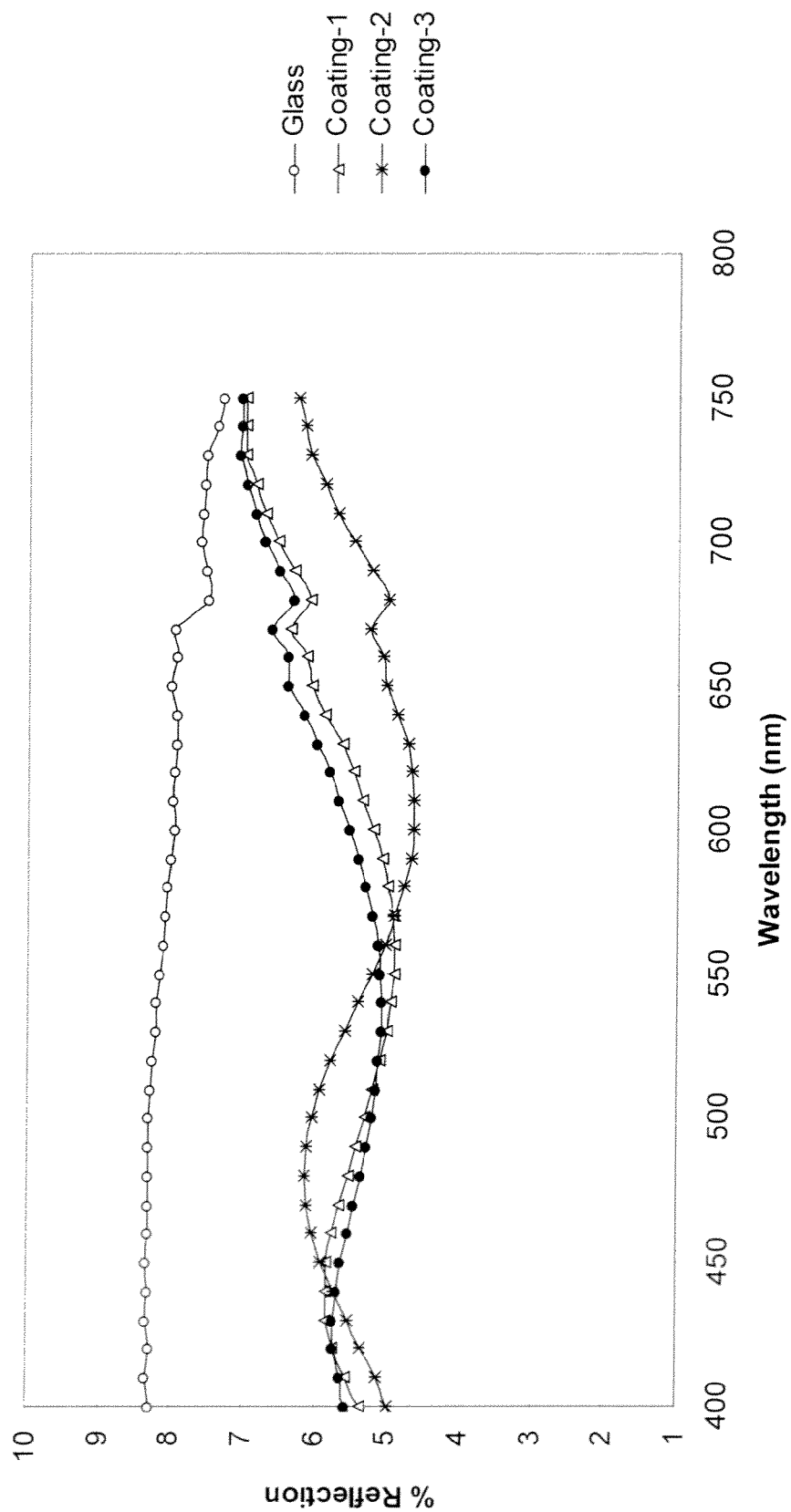
Figure 3: % Film side Reflection for AR coatings

MULTI-LAYER ANTI-REFLECTIVE COATINGS AND PROCESSES THEREFOR

FIELD

The invention relates to the development of novel processes for producing multi-layer anti-reflective (AR) coatings. The methods disclosed herein utilize photo-polymerization of conventional monomer mixtures comprising inorganic oxide precursors. The methods may be useful to form AR coatings of oxides of varying refractive indices on glass substrates.

BACKGROUND

Glass is desirable for numerous properties and applications, including optical clarity and overall visual appearance. In at least some applications, it may be desirable to optimize certain optical properties (such as light transmission, reflection and/or absorption properties). For example, in certain embodiments, a reduction of the reflection of light by the surface of a glass substrate may be desired, such as for windows (e.g., storefront windows), display cases, photovoltaic (PV) devices (e.g., solar cells), pictures frames, and so forth.

Photovoltaic devices, such as solar cells (and modules therefore), are known in the art. Glass is an integral part of most common commercial photovoltaic modules, including both crystalline and thin film types. A solar cell/module may include, for example, a photoelectric transfer film made up of one or more layers located between a pair of substrates. One or more of the substrates may be glass, and the photoelectric transfer film (typically semiconductor) is for converting solar energy to electricity. Example solar cells are disclosed in U.S. Pat. Nos. 4,510,344, 4,806,436, 5,977,477, and 6,506,622, and JP 07-122764, the disclosures of which are hereby incorporated herein by reference.

In a solar cell where the substrate is glass, incoming radiation passes through the incident glass substrate of the solar cell before reaching the active layer(s) (e.g., photoelectric transfer film such as a semiconductor) of the solar cell. Radiation that is reflected by the incident glass substrate does not make its way into the active layer(s) of the solar cell, thereby resulting in a less efficient solar cell. Thus, it would be desirable in at least certain embodiments to decrease the amount of radiation that is reflected by the incident substrate, thereby increasing the amount of radiation that makes its way to the active layer(s) of the solar cell. In particular, the power output of a solar cell or PV module may be dependant upon the amount of light, or number of photons, within a specific range of the solar spectrum that pass through the incident glass substrate and reach the PV semiconductor.

Because the power output of the module may depend upon the amount of solar light that passes through the glass and reaches the PV semiconductor, certain attempts have been made to boost overall solar transmission through the glass used in PV modules. One attempt is the use of iron-free or "clear" glass, which may increase the amount of solar light transmission when compared to regular float glass, through absorption minimization.

In another attempt to address this problem, an AR coating is deposited on a glass substrate, which may be deposited on either side of the glass substrate. An AR coating may increase transmission of light through the light incident substrate, and thus the power of a PV module.

Conventional wet chemical techniques to produce AR oxide coatings may employ sol-gel processes involving hydrolysis and condensation reactions of alkoxides, such as titanium alkoxides and silicon alkoxides. Precursor coatings that may be formed from these sols may be fired at elevated temperatures to convert them to oxide coatings. During thermal processing of coatings, heating profiles of gradual temperature ramp rates may be employed to burn off organic content and form oxide coatings.

Typically in these processes, liquid sols may be aged for several hours after preparation in order to ensure thorough hydrolysis of precursor alkoxides. The stability of sols may be affected by several factors including pH, water content, concentration of solids, etc. Chelating ligands, such as 2,4-pentanedione, may be added in some instances to prolong shelf life of the liquid sols. However, producing stable sols at manufacturing volumes can be challenging. While the shelf life of sols may be influenced by storage and transportation conditions, the useful pot life during processing may be affected by loss of volatiles and exposure to ambient humidity, etc.

In the case of manufacture of multiple-layer coatings, each layer must be heat cured in order to develop sufficient solvent resilience before the next layer is deposited. Thus, the process of making multi-layered precursor coatings using conventional sol-gel processes may become complicated and tedious, and may adversely affect the cost of production. Accordingly, there exists a need for a method to produce multi-layer precursor oxide coatings without the need for traditional thermal processing of each layer prior to depositing subsequent layers.

The inventor has now discovered novel methods to produce multi-layered AR coatings on a substrate, which may increase transmission of light through the substrate.

BRIEF SUMMARY OF EXAMPLE EMBODIMENTS OF THE INVENTION

In accordance with various exemplary embodiments of the invention, there is provided methods of making multi-layer AR coatings made by forming un-solgel precursor compositions comprising at least one inorganic oxide precursor and at least one UV curable monomer; depositing a first coating layer of an un-solgel precursor composition on a substrate; curing the first coating layer through exposure to electromagnetic radiation; depositing at least one additional coating layer of an un-solgel precursor composition on the first cured coating layer; curing the at least one additional coating layer through exposure to electromagnetic radiation to form a cured coating stack; and heating the cured coating stack to burn off organic content and form oxide layers.

Other exemplary embodiments of the invention relate to coated substrates, such as coated glass substrates, comprising: a substrate comprising a multi-layered AR coating provided on the substrate; wherein the multi-layered AR coating is made by forming at least one un-solgel precursor composition comprising at least one inorganic oxide precursor and at least one UV curable monomer; depositing a first coating layer of an un-solgel precursor composition on a substrate; curing the first coating layer through exposure to electromagnetic radiation; depositing at least one additional coating layer of an un-solgel precursor composition on the first cured coating layer; curing the at least one additional coating layer through exposure to electromagnetic radiation to form a cured coating stack; and heating the coated substrate comprising the cured coating layers to burn off organic content.

Other exemplary embodiments of the invention relate to PV devices, such as a solar cell, comprising: a PV layer and at least one glass substrate on a light-incident side of the PV layer; a multi-layered AR coating provided on the glass substrate, the multi-layered AR coating being located on a light-incident side of the glass substrate; wherein the multi-layered AR coating is made by forming at least one un-solgel precursor composition comprising at least one inorganic oxide precursor and at least one UV curable monomer; depositing a first coating layer of an un-solgel precursor composition on at least one glass substrate; curing the first coating layer through exposure to electromagnetic radiation; depositing at least one additional coating layer of an un-solgel precursor composition on the first cured coating layer; curing the at least one additional coating layer through exposure to electromagnetic radiation to form a cured coating stack; and heating the coated glass substrate comprising the cured coating layers to burn off organic content.

Other exemplary embodiments of the invention relate to PV devices comprising: a PV film and at least one glass substrate on a light-incident side of the PV film; a multi-layered AR coating provided on the glass substrate; wherein the multi-layered AR coating comprises at least one coating layer provided directly on and contacting the glass substrate, the layer produced using a method comprising the steps of: forming at least one un-solgel precursor composition comprising at least one inorganic oxide precursor and at least one UV curable monomer; depositing a first coating layer of an un-solgel precursor composition on at least one glass substrate; curing the first coating layer through exposure to electromagnetic radiation; depositing at least one additional coating layer of an un-solgel precursor composition on the first cured coating layer; curing the at least one additional coating layer through exposure to electromagnetic radiation to form a cured coating stack; and heating the coated glass substrate comprising the cured coating layers to burn off organic content.

As used herein, "multi-layered" means that the coating has more than one layer. By way of example, the coating may have two, three, four, or more layers.

As used herein, "anti-reflective" or "AR" means that the coatings having light reflectance of less than about 1.5%, such as, for example, less than about 1.0%, at wavelengths of between about 475 nm to about 575 nm.

As used herein, the term "sol-gel precursor composition" means a chemical solution composition comprising a metal alkoxide compound within the chemical solution that forms a polymerized alkoxide coating via hydrolysis and condensation reactions followed by removal of solvent by heating or any other means.

As used herein, the term "un-solgel precursor composition" means a chemical solution comprising a metal alkoxide compound and a UV curable organic monomer within the chemical solution that forms an oxide precursor coating when subjected to UV radiation.

As used herein, the term "cured coating stack" means at least two cured coating layers deposited on a substrate.

As described herein, the invention relates to methods of making multi-layered AR coatings, substrates comprising such coatings, and PV devices comprising such substrates and coatings. In the following description, certain aspects and embodiments will become evident. It should be understood that the invention, in its broadest sense, could be practiced without having one or more features of these aspects and embodiments. It should be understood that these aspects and embodiments are merely exemplary and explanatory, and are not restrictive of the invention as claimed.

BRIEF DESCRIPTION OF THE DRAWINGS

The following figures, which are described below and which are incorporated in and constitute a part of the specification, illustrate exemplary embodiments of the invention and are not to be considered limiting of the scope of the invention, for the invention may admit to other equally effective embodiments.

FIG. 1 shows refractive indices and extinction coefficients of coatings made in accordance with exemplary embodiments of the present invention.

FIG. 2 shows percentage of transmission of coatings made in accordance with exemplary embodiments of the present invention.

FIG. 3 shows percentage of light reflection of coatings made in accordance with exemplary embodiments of the present invention.

DESCRIPTION OF EXEMPLARY
EMBODIMENTS OF THE INVENTION

Reference will now be made to various exemplary embodiments of the invention, examples of which are illustrated in the accompanying figures. However, these various exemplary embodiments are not intended to limit the disclosure, but rather numerous specific details are set forth in order to provide a thorough understanding of the invention. It will be apparent to one skilled in the art that the invention may be practiced without some or all of these specific details, and the disclosure is intended to cover alternatives, modifications, and equivalents. For example, well-known features and/or process steps may not have been described in detail so as not to unnecessarily obscure the invention.

The present invention contemplates methods for making multi-layer AR coatings that may be provided in coated articles such as those used in devices such as PV devices, windows (e.g., storefront windows), display cases, picture frames, and the like. In certain example embodiments (e.g., in PV devices, such as solar cells), the multi-layer AR coating may be provided on either the light incident side or the other side of a substrate (e.g., glass substrate), such as a front glass substrate of a PV device.

Although described in connection with a multi-layered AR coating on a glass substrate, it should be understood that certain embodiments of the present invention relate to multi-layer AR coatings for silicon wafers.

In certain exemplary embodiments, a multi-layered AR coating may be provided on an incident glass substrate of a solar cell or the like. This multi-layered AR coating may function to reduce reflection of solar light from the glass substrate, thereby allowing more solar light to pass through the incident glass substrate and reach the PV semiconductor so that the solar cell can be more efficient. In other exemplary embodiments of this invention, such a multi-layered AR coating may be used in applications other than PV devices (e.g., solar cells), such as in windows (e.g., storefront windows), display cases, picture frames, greenhouse glass/windows, solariums, and the like. The glass substrate may be a glass superstrate or any other type of glass substrate useful for the specific application.

In various exemplary embodiments, the multi-layer AR coatings may be formed on a substrate. Accordingly, substrates coated with a multi-layer AR coating according to various exemplary embodiments of the invention are also contemplated herein. One of skill in the art will readily appreciate the types of substrates which may be coated with exemplary coatings as described herein.

In at least one exemplary embodiment, the substrate may comprise a glass substrate. By way of example only, the glass substrate may be chosen from standard clear glass, such as float glass, matte/matte, and matte/prismatic, or a low iron glass, such as ExtraClear™, UltraWhite™, or Solar glasses available from Guardian Industries. Furthermore, the glass substrate may be of any of the glasses described in U.S. patent application Ser. Nos. 11/049,292 and 11/122,218, the disclosures of which are hereby incorporated herein by reference. In various exemplary embodiments, the glass substrate may optionally comprise a pattern. No matter the composition of the glass substrate, however, in at least certain embodiments the multi-layer AR coatings produced in accordance with the present invention may increase transmission of light, such as, for example, to the active semiconductor film of a PV device.

Certain glasses for glass substrates according to exemplary embodiments of this invention utilize soda-lime-silica flat glass as their base composition/glass. In addition to the base composition of the glass, a colorant portion may be provided in order to achieve a glass that is fairly clear in color and/or has a high visible transmission. An exemplary soda-lime-silica base glass composition according to certain embodiments of this invention may comprise, on a weight percentage basis: $SiO_2$ 67 to 75%; $Na_2O$ 10 to 20%; CaO 5 to 15%; MgO 0 to 7%; $Al_2O_3$ 0 to 5%; $K_2O$ 0 to 5%; $Li_2O$ 0 to 1.5%; and BaO 0 to 1%.

Other minor ingredients, including various conventional refining aids, such as $SO_3$, carbon, and the like may also be included in the base glass composition. In at least certain embodiments, for example, glass useful according to various embodiments of the invention described herein may be made from raw batch materials including silica sand, soda ash, dolomite, and limestone, with the use of sulfate salts such as salt cake ($Na_2SO_4$) and/or Epsom salt ($MgSO_4.7H_2O$) and/or gypsum (e.g., about a 1:1 combination of any) as refining agents. In certain exemplary embodiments, soda-lime-silica based glass compositions useful according to various embodiments of the invention described herein comprise from about 10 to 15% $Na_2O$ and from about 6 to 12% CaO, by weight.

In addition to the base glass composition described above, glass according to certain exemplary embodiments of the instant invention may include materials such as colorants and/or oxidizers, which may cause the resulting glass to be fairly neutral or clear in color (slightly yellow in certain example embodiments, indicated by a positive b* value) and/or have a high visible light transmission. These colorant and/or oxidizing materials may either be present in the raw materials (e.g., small amounts of iron), or may be added to the base glass materials in the batch (e.g., cerium, erbium and/or the like). In at least certain exemplary embodiments, the resulting glass may have a visible transmission of at least 75%, such as, for example, at least 80%, at least 85%, or at least 90% (Lt D65). In certain example non-limiting instances, such high transmissions may be achieved at a reference glass thickness of about 3 to 4 mm.

In various exemplary embodiments, in addition to the base glass composition, the glass and/or glass batch may comprise, on a weight percentage basis, the following additional ingredients: $Fe_2O_3$, 0.001 to 0.06%, such as, for example, 0.005 to 0.04%, and further, for example, 0.01 to 0.03%; cerium oxide, 0 to 0.30%, such as, for example, 0.01 to 0.12%, and further, for example, 0.01 to 0.07%; $TiO_2$, 0 to 1.0%, such as, for example, 0.005 to 0.1%, and further, for example, 0.01 to 0.04%; and erbium oxide, 0.05 to 0.5%, such as, for example, 0.1 to 0.5%, and further, for example, 0.1 to 0.35%.

In at least certain exemplary embodiments, the total iron content (expressed herein as $Fe_2O_3$) of the glass may be, for example, from 0.01 to 0.06%, such as, for example, from 0.01 to 0.04%, and further, for example, from 0.01 to 0.03%. In at least certain example embodiments of this invention, the glass composition may be substantially free of other colorants (other than potentially trace amounts).

However, it should be appreciated that other materials (e.g. refining aids, melting aids, colorants and/or impurities) may be present in the glass in certain exemplary embodiments of this invention as long as any such materials do not substantially interfere with the purpose(s) and/or goal(s) of the particular embodiment (e.g. increased light transmission). For instance, in at least certain example embodiments of this invention, the glass composition may be free of, or substantially free of, one or more of: erbium oxide, nickel oxide, cobalt oxide, neodymium oxide, chromium oxide, and selenium. The phrase "substantially free of" means no more than 2 ppm, and possibly as low as 0 ppm, of the element or material. It is noted that while cerium oxide may be used in various embodiments of this invention, it is not required in all embodiments and indeed may be intentionally omitted in many instances. However, in at least certain example embodiments of this invention, small amounts of erbium oxide may be added to the glass in the colorant portion (e.g., from about 0.1 to 0.5% erbium oxide).

The total amount of iron present in the glass batch and in the resulting glass, i.e., in the colorant portion thereof, is expressed herein in terms of $Fe_2O_3$ in accordance with standard practice. This, however, does not imply that all iron is actually in the form of $Fe_2O_3$. Likewise, the amount of iron in the ferrous state ($Fe_{+2}$) is reported herein as FeO, even though all ferrous state iron in the glass batch or glass may not be in the form of FeO. As mentioned above, iron in the ferrous state ($Fe_{2+}$; FeO) is a blue-green colorant, while iron in the ferric state ($Fe_{3+}$) is a yellow-green colorant; and the blue-green colorant of ferrous iron may be of particular concern, since as a strong colorant it introduces significant color into the glass which can sometimes be undesirable when seeking to achieve a neutral or clear color.

It is noted that the light-incident surface of the substrate may be flat, curved, smooth, textured, patterned, etc., in different example embodiments of this invention. One of skill in the art will be able to determine an appropriate substrate surface for any particular application.

While certain exemplary embodiments of the multi-layer AR coatings discussed above may be used in the context of the PV devices/modules, this invention is not so limited. Multi-layer AR coatings according to this invention may be used in other applications such as for picture frames, fireplace doors, and the like.

Also, in at least certain embodiments of the present invention, other layer(s) may be provided on the substrate under the multi-layer AR coating so that the multi-layer AR coating is considered to be "on" the substrate even if other layers are provided therebetween, such that the AR coating is not in direct contact with the substrate. For example, it is possible to provide other layer(s) between a glass substrate and the first coating layer of the multi-layer AR coating, in various exemplary embodiments of the invention.

Exemplary non-limiting embodiments of this invention provide new methods to produce multi-layer AR coatings, which may have suitable light transmission properties for a particular application. Exemplary embodiments described herein provide methods of making multi-layer AR coatings containing at least one inorganic oxide and at least one UV curable monomer. In certain exemplary embodiments of this invention, the coatings may be based, at least in part, on at least one un-solgel precursor composition comprising (a) at least one inorganic oxide precursor, such as, for example, titanium alkoxides and silicon alkoxides, and (b) at least one UV curable monomer.

In exemplary embodiments of the present invention, the multi-layer AR coatings comprise at least two coating layers made from un-solgel precursor compositions, wherein at least two of the coating layers have different refractive indices. By way of example only, the multi-layer AR coating may comprise three coating layers, including, for example, a low refractive index coating layer, a high refractive index coating layer, and/or a medium refractive index coating layer, where at least two of the three coating layers have different indices of refraction. For example, there may be a medium refractive index coating layer (such as, for example, a titania-silica coating) on the light incident side of a substrate, a high refractive index coating layer (such as, for example, a titania coating) on the medium refractive index coating layer, and a low refractive index coating layer (such as, for example, a silica coating) on the high refractive index coating layer. One of skill in the art will readily appreciate that the at least two coating layers of different refractive indices can be placed on the surface of the substrate in any order.

As used in the preceding paragraph, a "high" refractive index is between 1.8 and 2.4 and 550 nm; a "low" refractive index is between 1.35 and 1.5 at 550 nm; and a "medium" refractive index is between 1.5 and 1.8 at 550 nm.

Examples of inorganic oxide precursors that may be used in un-solgel precursor compositions according to the invention include, but are not limited to, titanium alkoxides, silicon alkoxides, and mixtures thereof.

Examples of titanium alkoxides that may be used in un-solgel precursor compositions according to the invention include, but are not limited to, titanium n-butoxide, titanium tetra-iso-butoxide (TTIB), titanium isopropoxide, titanium ethoxide, and mixtures thereof. In at least one embodiment, the titanium alkoxide un-solgel precursor composition comprises titanium n-butoxide. The amount of the titanium alkoxides in the un-solgel precursor compositions may range from 0.1 to 20% by weight, such as, for example, 0.5% to 5% by weight, and further, for example, 1 to 3% by weight, relative to the total weight of the un-solgel precursor composition.

Examples of silicon alkoxides that may be used in un-solgel precursor compositions according to the invention include, but are not limited to, gamma-methacryloxypropyl trimethoxy silane, tetra ethoxy silane, and mixtures thereof. In at least one embodiment, the silicon alkoxide un-solgel precursor composition comprises gamma-methacryloxypropyl trimethoxy silane. The amount of the silicon alkoxides in the un-solgel precursor compositions may range from 0.1 to 20% by weight, such as, for example, 0.5% to 5% by weight, and further, for example, 1 to 3% by weight, relative to the total weight of the un-solgel precursor composition.

The term "UV curable monomer" should be understood to mean a monomer curable by electromagnetic radiation, which also may include further polymerizable oligomers and polymers. Rapid curing of such a monomer may result, for example, from any form of electromagnetic radiation that generates free radicals and ions. For example, free radical initiation can be effectively provided by a source of UV light (or other electromagnetic radiation) or electron beams. In at least one embodiment of the present invention, the at least one UV curable monomer may comprise a mixture of monomers generally known to those skilled in the art as capable of being cured by UV radiation. For example, the UV curable monomer mixture may comprise UV-curable epoxies, UV-curable acrylates, and/or UV-curable urethanes such as, for example, commercially available epoxies, acrylates, and/or urethanes, including those available from Redspot, Vantec, Tangent, Dymax, Loctite, etc. In certain non-limiting embodiments, the UV curable monomer mixture may be Radur 401 UV clear from Van Technologies, MN, or UVB-370 supplied by Red Spot Inc., IN. The amount of UV curable monomer mixture in the un-solgel precursor compositions may range from 10 to 99% by weight, such as, for example, 20 to 80% by weight, and further, for example, 40 to 60% by weight, relative to the total weight of the un-solgel precursor composition.

In at least one embodiment, the un-solgel precursor compositions may further comprise a solvent, such as, for example, n-propanol, isopropanol, methylethylketone, other well-known alcohols (e.g., ethanol), and other well-known organic solvents (e.g., toluene).

In at least one embodiment, the un-solgel precursor compositions may further comprise a surfactant and/or anti-foaming agents, which may, in some embodiments, improve the coating process and/or adjust the rheological characteristics and other properties as desired. Examples of surfactants which may be used in accordance with the invention include, but are not limited to, non-ionic surfactants such as alkyl polysaccharides, castor oil ethoxylates, ceto-stearyl alcohol ethoxylates, decyl alcohol ethoxylates, and ethylene glycol esters. Examples of anti-foaming agents which may be used in accordance with the present invention include, but are not limited to, oil-based, powder, water-based, and ethylene oxide/propylene oxide (EP/PO)-based anti-foaming agents. In at least one exemplary embodiment, reactive diluents may be used to produce formulations containing no volatile organic matter. Some embodiments may comprise colloidal silica dispersed in monomers or organic solvents. Depending on the particular embodiment, the weight ratio of colloidal silica and other silica precursor materials may be varied. Similarly (and depending on the embodiment), the weight percentage of solids in the un-solgel precursor compositions may be varied.

In at least one embodiment, the un-solgel precursor compositions may further comprise a photoinitiator. The weight ratio of photoinitiator present in the un-solgel precursor compositions may range, for example, from 0.1 to 10% by weight, such as, for example, 0.1 to 8% by weight, and further, for example, 0.1 to 2% by weight.

In at least one embodiment of the present invention, the multi-layer AR coatings may be made by forming at least two un-solgel precursor compositions, depositing a first coating layer of an un-solgel precursor composition on a substrate, curing the first coating layer through exposure to electromagnetic radiation, depositing at least one additional coating layer of an un-solgel precursor composition on the first cured coating layer, curing the at least one additional coating layer through exposure to electromagnetic radiation, and heating the substrate comprising the cured coating layers to form a substrate comprising a multi-layer AR coating.

In various exemplary embodiments, the substrate may be coated with a first coating layer of an un-solgel precursor composition by any method known to those of skill in the art for coating substrates, such as, for example, spin-coating, spray-coating, dip-coating, roller-coating, flow-coating, etc.

In certain exemplary embodiments, the first coating layer is cured after it is deposited onto the substrate. The curing of the first coating layer may occur through exposure to electromagnetic radiation (e.g., UV radiation) for an appropriate amount of time, such as, for example, for 5 to 120 seconds, for example, for 10 to 90 seconds, and further, for example, for 30 to 40 seconds. The appropriate amount of time for curing the first coating layer by exposure to electromagnetic radiation for any particular coating composition, substrate composition, and/or application is within the ability of those skilled in the art to determine.

In certain exemplary embodiments, after the first coating layer is cured, at least one additional coating layer of an un-solgel precursor composition is deposited on the first coating layer. The at least one additional coating layer of an un-solgel precursor composition may be deposited on the first cured coating layer by any technique known to those of skill in the art (e.g., spin-coating, spray-coating, dip-coating, roller-coating, flow-coating, etc.). One of skill in the art will appreciate that the first coating layer and the at least one additional coating layer of un-solgel precursor compositions may be deposited on the substrate by the same or different methods.

The at least one additional coating layer may subsequently be cured through exposure to electromagnetic radiation (e.g., UV radiation), for an appropriate amount of time, such as the same as or different than the period of time the first coating layer may be cured. The appropriate length of time for curing of the at least one additional coating layer of un-solgel precursor compositions is within the ability of those skilled in the art to determine, based on, for example, the particular coating composition, the previous coating compositions, the substrate composition, the application, etc. One of skill in the art will readily appreciate that the depositing and curing of additional un-solgel precursor compositions may be repeated as much as desired to form, for example, two, three, four, five, six, and more cured coating layers.

In addition, the composition of the atmosphere's gas may be controlled during curing; that is, the curing may occur, for example, in an inert atmosphere of nitrogen or argon or in an atmosphere of other suitable gas. Furthermore, partial curing is contemplated and included within the term "curing" and its variants.

In certain exemplary embodiments, the substrate comprising the cured coating layers may be heated. By way of example, the substrate comprising the cured coating layers may be heated (e.g., fired) in a furnace at a temperature ranging from, for example, 550 to 700° C., such as, for example, from 575 to 675° C., and further, for example, from 600 to 650° C. The heating may occur for a suitable length of time to create a multi-layer AR coating, such as, for example, between 1 and 10 minutes, and further, for example, between 3 and 7 minutes. One skilled in the art will appreciate, however, that other temperatures and heating times may be used and should be chosen such that the multi-layer AR coating is formed. Thus, one skilled in the art may choose the temperature and heating time based on, for example, the appropriate temperature and time for heating to form the multi-layer AR coating, the properties of the desired multi-layer AR coating, such as thickness of the multi-layer AR coating or thickness of the substrate, etc. For example, a thinner multi-layer AR coating may require heating at a lower temperature or for a shorter time than a thicker coating. Similarly, a substrate that is thicker or has lower heat transfer may require a higher temperature or a longer heating time than a substrate that is thinner or has a higher heat transfer. In at least some embodiments, the coating layers must be heated to a temperature of not less than 400° C. in order to burn off the organic components of the coating layers. As used herein, the phrase "heated at" a certain temperature means that the furnace is set at the specified temperature. As used herein, the phrase "heated to" a certain temperature means that the coating layers themselves are heated to reach the specified temperature. Determination of the appropriate heating time and temperature is well within the ability of those skilled in the art.

In accordance with various exemplary embodiments, the thickness of one or more of the coating layers, and thus the total thickness of the multiple coating layers, may vary. Therefore, the total thickness of all the coatings, after both curing and heating, depends on both the thickness of each individual layer deposited on the substrate and on the number of coating layers deposited on the substrate.

The present invention is further illustrated by the following non-limiting examples, which are provided to further aid those of skill in the art in the appreciation of the invention.

Unless otherwise indicated, all numbers herein, such as those expressing weight percents of ingredients and values for certain physical properties, used in the specification and claims are to be understood as being modified in all instances by the term "about," whether so stated or not. It should also be understood that the precise numerical values used in the specification and claims form additional embodiments of the invention. Efforts have been made to ensure the accuracy of the numerical values disclosed in the Examples. All described and claimed numerical values and ranges are approximate and include at least some degree of variation. Any measured numerical value, however, can inherently contain certain errors resulting from the standard deviation found in its respective measuring technique.

As used herein, a "wt %" or "weight percent" or "percent by weight" of a component, unless specifically stated to the contrary, is based on the total weight of the composition or article in which the component is included. As used herein, all percentages are by weight unless indicated otherwise.

It is noted that, as used in this specification and the appended claims, all numerical ranges include the stated, numerical end points and all subranges therebetween.

It is noted that, as used in this specification and the appended claims, the singular forms "a," "an," and "the," include plural referents unless expressly and unequivocally limited to one referent, and vice versa. Thus, by way of example only, reference to "a substrate" can refer to one or more substrates, and reference to "an un-solgel precursor composition" can refer to one or more un-solgel precursor compositions. As used herein, the term "include" and its grammatical variants are intended to be non-limiting, such that recitation of items in a list is not to the exclusion of other like items that can be substituted or added to the listed items.

EXAMPLES

An example of a multi-layer AR coating comprising a high refractive index layer, a medium refractive index layer, and a low refractive layer is given. A high refractive index un-solgel precursor composition was formed using a titanium alkoxide precursor, and a low refractive index un-solgel precursor composition was formed using a silicon alkoxide precursor. A medium refractive index un-solgel precursor composition was formed by combining titanium alkoxide and silicon alkoxide precursors. The un-solgel precursor compositions were prepared by combining the noted oxide precursor materials with a UV curable monomer mixture.

Example 1

High Refractive Index Titania Formulation (Coating 1)

A stable titania (i.e., titanium dioxide) precursor formulation was prepared by adding 1.5 g of titanium tetra n-butoxide, 2.5 g of acetic acid, and 5 g of n-propanol to 15 g of UV curable acrylic monomer mixture (commercially available as UVB-370® from Red Spot Inc., IN). The concentration of titanium dioxide in this formulation was about 1.47% by weight. This coating formulation was applied within minutes after preparation to two soda lime glass substrates by spin coating. The coatings were cured at room temperature by exposure to UV radiation for about 30-40 seconds, and then fired at 625° C. for 5 minutes to form titania coatings. Spin coating at 600 and 800 RPM for 30 seconds yielded coatings of about 7.2 and 6.3 µm after UV curing, respectively, and, after heating, the thickness of the titania coatings were 105 and 89 nm, respectively. The refractive index of the titania coating was measured to be 2.01 at 550 nm, as shown in FIG. 1.

Example 2

Low Refractive Index Silica Formulation (Coating 2)

A stable silica precursor formulation was prepared by adding 1.06 g of gamma-methacryloxypropyl trimethoxy silane to 18.97 g of UV curable acrylic monomer mixture (commercially available as UVB-370® from Red Spot Inc., IN). The concentration of silicon dioxide in this formulation was about 1.28% by weight. This coating formulation was applied within minutes after preparation to two soda lime glass substrates by spin coating. The coatings were cured at room temperature by exposure to UV radiation for about 30-40 seconds, and then fired at 625° C. for 5 minutes to form silica coatings. Spin coating at 2000 and 2500 RPM for 30 seconds yielded coatings of about 9.83 and 8.3 µm after UV curing, respectively, and, after heating, the thickness of the silica coatings were 105 and 93 nm, respectively. Refractive index of the silica coating was measured to be 1.45 at 550 nm.

Example 3

Medium Refractive Index Titania-Silica Formulation (Coating 3)

A stable titania-silica precursor formulation was prepared by adding 0.30 g of gamma-methacryloxypropyl trimethoxy silane to 10 g of a high refractive index titania sol prepared as described above in Example 1. The solid content expressed in terms of oxides was about 2.14%, and the mole ratio of titania to silica was 60/40. This coating formulation was applied within minutes after preparation to two soda lime glass substrates by spin coating. The coatings were cured at room temperature by exposure to UV radiation for about 30-40 seconds, and then fired at 625° C. for 5 minutes to obtain a medium index titania-silica coating. Spin coating at 2000 and 2500 RPM for 30 seconds yielded coatings of about 3.3 and 2.93 µm after UV curing, respectively, and, after heating, the thickness of the titania-silica coatings were 85 and 80 nm, respectively. The refractive index of the titania-silica coating was measured to be 1.75 at 550 nm, as shown in FIG. 1.

Example 4

Preparation of Three-Layer AR Coatings on Glass Substrate

The medium refractive index coating formulation of Example 3 was first applied to three glass substrates by spin coating (3500 RPM for 30 seconds). The resulting wet coatings were exposed to UV radiation to form a hard polymer film. The high refractive index coating formulation of Example 1 was then applied to each substrate (700, 750, and 800 RPM for 30 seconds) to form coatings of slightly varying coating thickness. The resulting wet coatings were cured at room temperature by exposure to UV radiation for about 30-40 seconds, and the process was repeated to deposit the final layer of low refractive index coating of Example 2 on each substrate (3000 RPM for 30 seconds). The coating stack thus produced was hard and durable and can be stored in a warehouse. The coating stack was fired in a box furnace at 625° C. for 5 minutes to form a multi-layer AR coating. The % reflection of this glass was diminished and the % transmission enhanced, as shown in FIGS. 2 and 3.

It will be apparent to those skilled in the art that various modifications and variation can be made to the present disclosure without departing from the scope its teachings. Other embodiments of the disclosure will be apparent to those skilled in the art from consideration of the specification and practice of the teachings disclosed herein. It is intended that the embodiments described in the specification be considered as exemplary only.

What is claimed is:

1. A method of making a multi-layer anti-reflective coating, comprising:
    preparing at least two un-solgel precursor compositions, wherein each of said at least two un-solgel precursor compositions comprises at least one inorganic oxide precursor and at least one UV curable monomer;
    depositing a first coating layer of one of said un-solgel precursor compositions on a substrate;
    curing said first coating layer by exposing said first coating layer to electromagnetic radiation;
    depositing at least one additional coating layer of one of said un-solgel precursor compositions on said first cured coating layer;
    curing said at least one additional coating layer by exposing said at least one additional coating layer to electromagnetic radiation; and
    heating said cured coating layers to remove substantially all organic content and form a multi-layer anti-reflective coating.

2. The method of claim 1, wherein at least two of said cured coating layers have different refractive indices after said heating step.

3. The method of claim 1, wherein said inorganic oxide precursor is chosen from at least one titanium alkoxide, silicon alkoxide, and mixtures thereof.

4. The method of claim 3, wherein said titanium alkoxide comprises titanium tetra n-butoxide.

5. The method of claim 3, wherein said silicon alkoxide comprises gamma-methacryloxypropyl trimethoxy silane.

6. The method of claim 1, wherein said at least one UV curable monomer is a UV curable acrylic monomer mixture.

7. The method of claim 1, wherein said substrate comprises a glass substrate.

8. The method of claim 1, wherein said exposure to electromagnetic radiation comprises exposure to ultraviolet (UV) radiation.

9. The method of claim 8, wherein said exposure to ultraviolet (UV) radiation comprises exposing said coating layers to UV radiation for a period of time ranging from about 5 to 120 seconds.

10. The method of claim 1, wherein said coated layers are heated at a temperature of from about 550 to 700° C. for a duration of from about 1 to 10 minutes.

11. The method of claim 1, wherein said at least one inorganic oxide precursor is present in each of said un-solgel precursor compositions in an amount ranging from 0.1 to 20 wt % relative to the total weight of each of said un-solgel precursor composition.

12. The method of claim 1, wherein said at least one UV curable monomer mixture is present in each of said un-solgel precursor compositions in an amount ranging from 10 to 99 wt % relative to the total weight of each of said un-solgel precursor composition.

* * * * *